US009607949B2

(12) United States Patent
Yamada (10) Patent No.: US 9,607,949 B2
(45) Date of Patent: Mar. 28, 2017

(54) SEMICONDUCTOR DEVICE HAVING SEMICONDUCTOR CHIPS IN RESIN AND ELECTRONIC CIRCUIT DEVICE WITH THE SEMICONDUCTOR DEVICE

(71) Applicant: Kabushiki Kaisha Toshiba, Minato-ku (JP)

(72) Inventor: Hiroshi Yamada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/641,864

(22) Filed: Mar. 9, 2015

(65) Prior Publication Data

US 2015/0270245 A1    Sep. 24, 2015

(30) Foreign Application Priority Data

Mar. 20, 2014  (JP) ................... 2014-059196

(51) Int. Cl.
*H01L 25/065*    (2006.01)
*H01L 23/538*    (2006.01)
(Continued)

(52) U.S. Cl.
CPC .......... *H01L 23/5386* (2013.01); *H01L 23/36* (2013.01); *H01L 23/4334* (2013.01);
(Continued)

(58) Field of Classification Search
CPC ... H01L 25/0652; H01L 24/17; H01L 23/293; H01L 23/3114; H01L 23/04;
(Continued)

(56) References Cited

U.S. PATENT DOCUMENTS 4,811,082 A    3/1989  Jacobs et al.
2003/0109079 A1    6/2003  Yamaguchi et al.
(Continued)

FOREIGN PATENT DOCUMENTS

JP    2007-260866 A    10/2007
JP    2009-194113 A    8/2009
(Continued)

OTHER PUBLICATIONS

Hiroshi Yamada, et al., "A Wafer-Level Heterogeneous Technology Integration for Flexible Pseudo-SoC", IEEE International Solid-State Circuits Conference, Feb. 9, 2010, pp. 146-148.
(Continued)

*Primary Examiner* — Alexander Oscar Williams
(74) *Attorney, Agent, or Firm* — Oblon, McClelland, Maier & Neustadt, L.L.P.

(57) ABSTRACT

A semiconductor device includes a first semiconductor unit including a plurality of first semiconductor chips, an organic resin provided between the first semiconductor chips, a wiring layer provided above the first semiconductor chips to electrically connect the first semiconductor chips to each other, and a plurality of connecting terminals provided on an upper portion of the wiring layer and a second semiconductor unit fixed to a wiring layer side of the first semiconductor unit, the second semiconductor unit fixed to a region sandwiched between the connecting terminals, the second semiconductor unit having a second semiconductor chip, the second semiconductor unit electrically connected to the first semiconductor unit.

19 Claims, 10 Drawing Sheets

(51) Int. Cl.
  *H01L 23/31* (2006.01)
  *H01L 23/04* (2006.01)
  *H01L 23/00* (2006.01)
  *H01L 23/29* (2006.01)
  *H01L 23/433* (2006.01)
  *H01L 23/36* (2006.01)
  *H01L 23/498* (2006.01)
  *H01L 21/56* (2006.01)

(52) U.S. Cl.
  CPC .... *H01L 23/49816* (2013.01); *H01L 23/5389* (2013.01); *H01L 24/19* (2013.01); *H01L 24/96* (2013.01); *H01L 25/0652* (2013.01); *H01L 21/568* (2013.01); *H01L 23/295* (2013.01); *H01L 2224/0401* (2013.01); *H01L 2224/04105* (2013.01); *H01L 2224/0558* (2013.01); *H01L 2224/05568* (2013.01); *H01L 2224/05644* (2013.01); *H01L 2224/05655* (2013.01); *H01L 2224/05666* (2013.01); *H01L 2224/12105* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13184* (2013.01); *H01L 2224/1403* (2013.01); *H01L 2224/14135* (2013.01); *H01L 2224/16225* (2013.01); *H01L 2224/24137* (2013.01); *H01L 2224/24195* (2013.01); *H01L 2224/32225* (2013.01); *H01L 2224/73204* (2013.01); *H01L 2224/94* (2013.01); *H01L 2924/01029* (2013.01); *H01L 2924/01047* (2013.01); *H01L 2924/1424* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01)

(58) Field of Classification Search
  CPC ............. H01L 23/5386; H01L 2924/12; H01L 2224/16113; H01L 2224/16145; H01L 2224/16245; H01L 2224/16157; H01L 2224/13166; H01L 2224/13155; H01L 2224/13124; H01L 2224/13147; H01L 2224/13144; H01L 2224/13139; H01L 2224/131116; H01L 2224/13111; H01L 21/60; H01L 23/34; H01L 25/065; H01L 23/538; H01L 23/31; H01L 23/00; H01L 23/29
  USPC ....... 257/724, 723, 686, 685, 777, 778, 737, 257/738, 734
  See application file for complete search history.

(56) References Cited

U.S. PATENT DOCUMENTS

| | | | |
|---|---|---|---|
| 2003/0215993 | A1 | 11/2003 | Oshima |
| 2004/0178488 | A1 | 9/2004 | Bolken et al. |
| 2005/0205996 | A1* | 9/2005 | Usui ........................ H01L 21/56 257/744 |
| 2006/0255472 | A1* | 11/2006 | Ohshima ............. H01L 25/0657 257/778 |
| 2007/0040267 | A1* | 2/2007 | Zhao ........................ H01L 21/50 257/706 |
| 2007/0066139 | A1* | 3/2007 | Roeper ............... H01L 23/3107 439/607.01 |
| 2007/0273014 | A1* | 11/2007 | Lee ........................ H01L 23/13 257/686 |
| 2007/0273018 | A1 | 11/2007 | Onozuka et al. |
| 2008/0298023 | A1* | 12/2008 | Okimoto ................ H05K 1/183 361/715 |
| 2008/0318356 | A1 | 12/2008 | Onozuka et al. |
| 2009/0045501 | A1* | 2/2009 | Gaynes ................... H01L 23/50 257/693 |
| 2009/0115067 | A1* | 5/2009 | Okimoto ............. H01L 23/5389 257/774 |
| 2009/0170241 | A1 | 7/2009 | Shim et al. |
| 2009/0206444 | A1 | 8/2009 | Yamada et al. |
| 2010/0001396 | A1 | 1/2010 | Meyer et al. |
| 2011/0031610 | A1* | 2/2011 | Yamazaki ........... H01L 23/4985 257/693 |
| 2011/0156229 | A1* | 6/2011 | Shinohara ......... H01L 23/49531 257/676 |
| 2011/0215478 | A1 | 9/2011 | Yamamichi et al. |
| 2012/0032314 | A1 | 2/2012 | Chen et al. |
| 2012/0038063 | A1 | 2/2012 | Meyer et al. |
| 2013/0093078 | A1 | 4/2013 | Lin et al. |
| 2013/0093097 | A1 | 4/2013 | Yu et al. |
| 2013/0200524 | A1 | 8/2013 | Han et al. |
| 2013/0343022 | A1 | 12/2013 | Hu et al. |
| 2015/0160701 | A1* | 6/2015 | Bruno ..................... H01L 25/16 361/679.31 |
| 2015/0270243 | A1* | 9/2015 | Yang ....................... H01L 24/32 438/118 |

FOREIGN PATENT DOCUMENTS

| | | |
|---|---|---|
| JP | 2009-200274 A | 9/2009 |
| JP | 2009-239147 A | 10/2009 |
| JP | 4568337 B2 | 10/2010 |
| JP | 2011-135108 A | 7/2011 |
| JP | 2013-004823 A | 1/2013 |
| JP | 2013-162128 A | 8/2013 |
| JP | 2013-187434 A | 9/2013 |
| WO | WO 2013/001171 A1 | 1/2013 |

OTHER PUBLICATIONS

Jinseong Kim, et al., "Application of Through Mold Via (TMV) as PoP Base Package", IEEE, Electronic Components and Technology Conference, 2008, pp. 1089-1092.

Yoichiro Kurita, et al., "Development of High-Density Inter-Chip-Connection Structure Package", MES, 2005, 4 pages (with English Abstract).

Partial European Search Report issued Aug. 21, 2015 in Patent Application No. 15155779.0.

Extended European Search Report issued Feb. 9, 2016, in Patent Application No. 15155779.0.

Combined Taiwanese Office Action and Search Report issued Mar. 25, 2016 in Patent Application No. 104105660 (with Partial English Translation).

* cited by examiner

SEMICONDUCTOR DEVICE HAVING SEMICONDUCTOR CHIPS IN RESIN AND ELECTRONIC CIRCUIT DEVICE WITH THE SEMICONDUCTOR DEVICE

CROSS-REFERENCE TO RELATED APPLICATION

This application is based upon and claims the benefit of priority from Japanese Patent Application No. 2014-059196, filed on Mar. 20, 2014, the entire contents of which are incorporated herein by reference.

FIELD

Embodiments described herein relate generally to a semiconductor device and an electronic circuit device.

BACKGROUND

In recent years, with increasingly large integration of a semiconductor device, large integration of semiconductor elements themselves constituting the semiconductor device is also required. Particularly, in integration technologies of recent semiconductor devices, in addition to integration of semiconductor elements themselves, integration of heterogeneous elements are required.

Two methods, the SoC (System on Chip) technology and the SiP (System in Package) technology, are typically known as methods of highly integrating semiconductor elements having heterogeneous functions. The SoC technology is an integration method of forming a plurality of elements as one chip such as system LSI. Unfortunately, while the SoC technology can increase the integration density of elements, device elements that can be integrated are limited. For example, it is difficult to combine device elements made of different crystal structure, such as GaAs device and Si device, due to different fabrication processes. In addition, the SoC technology has a problem of a longer design period when a new device is realized, which requires large investment for development of the new device.

In contrast to the SoC technology, the SiP technology is a method of individually forming each semiconductor chip and then mounting each chip individually on an integration substrate (interposer substrate). Because each semiconductor chip can individually be fabricated, no restrictions are imposed on fabrication process of elements to be integrated. Further, when a new SiP is realized, because chips already existing can be used, the design period can be shortened and therefore, development costs can be reduced compared to SoC. Unfortunately, however, the integration density of elements depends on the wiring density of an interposer substrate on which each semiconductor chip is mounted and thus, it is difficult to make integration density of elements higher than compared with the SiP technology.

Therefore, a pseudo-SoC technology is proposed. The pseudo-SoC is set up with heterogeneous chips embedded in epoxy resin, planar layer and redistributed layer. The heterogeneous chips are chips such as MEMS (Micro Electro Mechanical System), driver, CPU (Central Processing Unit) and memory. The heterogeneous chips are tested and selected as KGD (Known Good Die) chips before being redistributed and integrated to a chip-redistributed wafer. Thus heterogeneous device elements are integrated in one chip at a reduced cost, same as SiP. By forming redistributed layer with the most advanced semiconductor process, redistributed layer with fine pitch can be achieved. Thus integration with high density can also be achieved, same as SoC.

An improvement of mechanical strength is required in the pseudo-SoC technology. Particularly, when the size of heterogeneous chips to be arranged is large or when the number of heterogeneous chips to be arranged is large, the improvement of mechanical strength becomes more difficult.

DETAILED DESCRIPTION

A semiconductor device according to an embodiment includes a first semiconductor unit including a plurality of first semiconductor chips, an organic resin provided between the first semiconductor chips, a wiring layer provided above the first semiconductor chips to electrically connect the first semiconductor chips to each other, and a plurality of circuit board connecting terminals provided on an upper portion of the wiring layer and a second semiconductor unit fixed to a region sandwiched between the circuit board connecting terminals on a side of the wiring layer of the first semiconductor unit, having a second semiconductor chip, and electrically connected to the first semiconductor unit.

In this specification, the same reference numerals are attached to the same or similar members and a duplicate description may be omitted.

In this specification, for convenience sake, terms of "up", "above", "down", or "below" are used to show the relative physical relationship of components and so on. In this specification, the concepts of "up", "above", "down", and "below" are not necessarily terms showing the relationship to the direction of gravity.

First Embodiment

A semiconductor device according to the present embodiment includes a first semiconductor unit having a plurality of first semiconductor chips, an organic resin provided between the first semiconductor chips, a wiring layer provided above the first semiconductor chips to mutually and electrically connect the first semiconductor chips, and a plurality of circuit board connecting terminals provided on the upper portion of the wiring layer and a second semiconductor unit fixed to a region sandwiched between the circuit board connecting terminals on a side of the wiring layer of the first semiconductor unit, having a second semiconductor chip, and electrically connected to the first semiconductor unit.

By including the above configuration, a semiconductor device according to the present embodiment has mechanical strength improved by a reinforcing function of the second semiconductor unit. Therefore, a semiconductor device can be prevented from breakdown by stress strains when mounted on a circuit board. In addition, the semiconductor device can be made smaller in size by overlaying the second semiconductor unit having the second semiconductor chip on the first semiconductor unit.

Figure 1A:
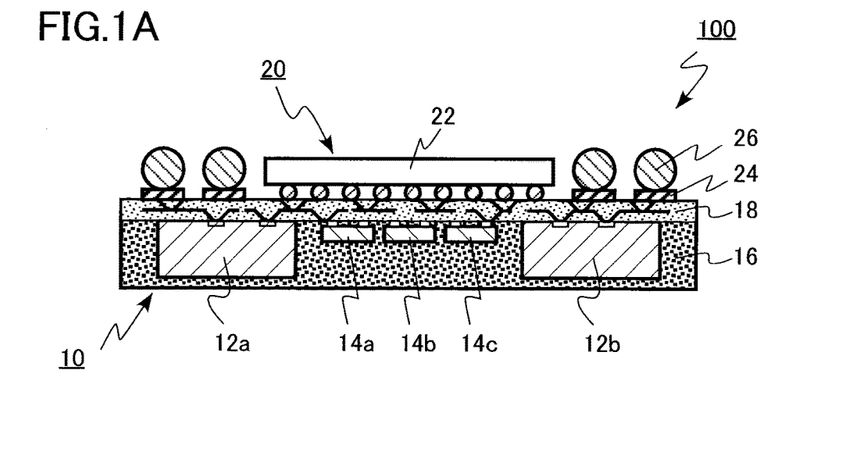
FIGS. 1A and 1B are schematic diagrams of a semiconductor device according to a first embodiment.
Figure 1B:
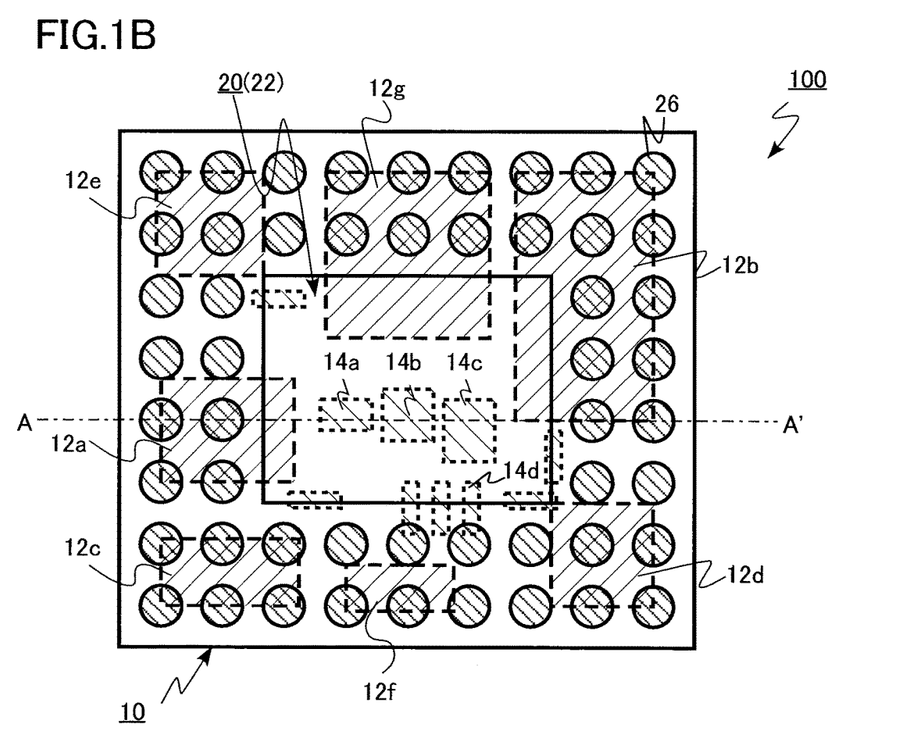

FIGS. 1A and 1B are schematic diagrams of a semiconductor device according to the present embodiment. FIG. 1A is a schematic sectional view and FIG. 1B is a schematic plan view. FIG. 1A is an AA' sectional view of FIG. 1B. In FIG. 1B, the disposition of first semiconductor chips and passive elements included in the first semiconductor unit is shown by dotted lines.

As shown in FIGS. 1A and 1B, a semiconductor device 100 according to the present embodiment includes a first semiconductor unit 10 and a second semiconductor unit 20 fixed to the first semiconductor unit 10.

The first semiconductor unit 10 includes a plurality of first semiconductor chips 12$a$-$g$ and a plurality of passive elements 14$a$-$d$. An organic resin 16 is provided between the first semiconductor chips 12$a$-$g$ and the passive elements 14$a$-$d$. The first semiconductor chips 12$a$-$g$ and the passive elements 14$a$-$d$ are physically supported by the organic resin 16.

A multilayer interconnection layer (wiring layer) 18 is provided on the first semiconductor chips 12$a$-$g$ and the passive elements 14$a$-$d$. The first semiconductor chips 12$a$-$g$ and the passive elements 14$a$-$d$ are electrically connected to each other by the multilayer interconnection layer (wiring layer) 18. The first semiconductor unit is a pseudo-SoC.

The first semiconductor chip 12$a$-$g$ is an active element. The first semiconductor chip 12$a$-$g$ is, for example, an analog switch, an operational amplifier, or the like. The plurality of first semiconductor chips may each be semiconductor chips having the same function or semiconductor chips having different functions.

The passive element 14$a$-$d$ is, for example, a chip resistor, a chip capacitor or the like. The plurality of passive elements 14$a$-$d$ may each be passive elements having the same function or passive elements having different functions.

The organic resin 16 desirably contains a silica filler. In addition, the organic resin 16 is desirably at least one organic resin selected from the epoxy resin, the polyimide resin, and benzocyclobutene (BCB).

The multilayer interconnection layer 18 is formed in a stacked structure of an insulating layer and a thin film wiring layer. The insulating layer is, for example, an organic resin and more specifically, for example, polyimide. The first semiconductor chips 12$a$-$g$ and the passive elements 14$a$-$d$ are electrically connected to each other by the thin film wiring layer. The thin film wiring layer is, for example, a metal and more specifically, for example, a stacked film of Al (aluminum) and Ti (titanium). The thin film wiring layer is desirably a metal or alloy containing at least one element selected from a group of Ti, Ni, Al, Cu, Au, Pb, Sn, Pd, and W.

A plurality of circuit board connecting terminals 24 is provided on the upper portion of the multilayer interconnection layer 18, that is, on the opposite side of the first semiconductor chips 12$a$-$g$ and the passive elements 14$a$-$d$ of the multilayer interconnection layer 18. The circuit board connecting electrode 24 is an electrode used to obtain an electric connection when the semiconductor device 100 is mounted on a circuit board.

The circuit board connecting terminals 24 are provided in a peripheral region of the first semiconductor unit 10. In the center of the first semiconductor unit 10, a region in which the circuit board connecting electrode 24 is not present is provided.

The circuit board connecting electrode 24 is a metal. More specifically, the circuit board connecting electrode is a stacked film of, for example, Au (gold), Ni (nickel), and Ti (titanium).

Ball electrodes 26 are provided on the circuit board connecting terminals 24. The ball electrode 26 is an electrode used to obtain an electric connection when the semiconductor device 100 is mounted on a circuit board.

The ball electrodes 26 are provided in a peripheral region of the first semiconductor unit 10. In the center of the first semiconductor unit 10, a region in which the ball electrode 26 is not present is provided.

The ball electrode 26 is, for example, PbSn alloy solder. As the material of the ball electrode 26, a metal or alloy containing at least one element selected from a group of Ti, Ni, Al, Cu, Au, Ag, Pb, Sn, Pd, and W can be applied.

The second semiconductor unit 20 is fixed to the side of the multilayer interconnection layer 18 of the first semiconductor unit 10. The second semiconductor unit 20 is fixed to a region of the multilayer interconnection layer 18 sandwiched between the circuit board connecting terminals 24 or the ball electrodes 26, in other words, to a region in which the circuit board connecting terminals 24 and the ball electrodes 26 are not present.

The second semiconductor unit 20 has a second semiconductor chip 22. The second semiconductor chip 22 is an active element. The second semiconductor chip 22 is, for example, LSI (Large Scale Integration). More specifically, the second semiconductor chip 22 is, for example, an MCU (micro control unit).

The second semiconductor unit 20 may be a bare chip of the second semiconductor chip 22 itself or a semiconductor package including the second semiconductor chip 22. From the viewpoint of making the semiconductor device 100 smaller in size, the second semiconductor unit 20 is desirably a bare chip or wafer level CSP (Chip Size Package).

The second semiconductor unit 20 is electrically connected to the first semiconductor unit 10. The second semiconductor unit 20 is, for example, a bare chip (second semiconductor chip) and is electrically connected and fixed to the first semiconductor unit 10 by being flip-chip mounted thereon.

To increase the strength of fixing the second semiconductor unit 20 to the first semiconductor unit 10, an encapsulation resin of an organic resin may be provided between the second semiconductor unit 20 and the first semiconductor unit 10.

From the viewpoint of making the semiconductor device 100 smaller in size and improving mechanical strength thereof, the area of the second semiconductor chip 22 is desirably larger than that of any of the plurality of first semiconductor chips 12a-g.

Figure 2:
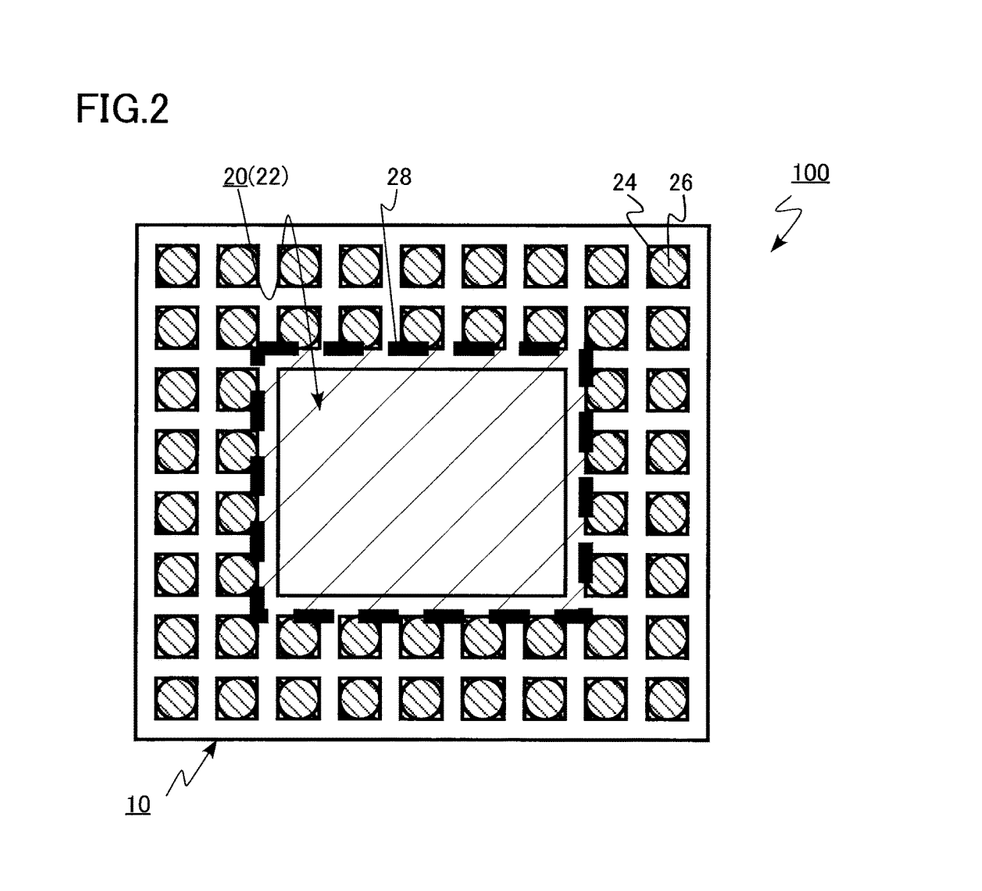
FIG. 2 is an explanatory view of a disposition of a second semiconductor unit of the semiconductor device according to the first embodiment.

FIG. 2 is an explanatory view of the disposition of a second semiconductor unit of the semiconductor device according to the present embodiment. FIG. 2 is a plan view when the semiconductor device 100 is viewed from the multilayer interconnection layer 18 side. As described above, the second semiconductor unit 20 is fixed to a region of the multilayer interconnection layer 18 sandwiched between the circuit board connecting terminals 24 or the ball electrodes 26, in other words, to a region in which the circuit board connecting terminals 24 and the ball electrodes 26 are not present.

In FIG. 2, a region in which the circuit board connecting terminals 24 and the ball electrodes 26 are not present is indicated by a rectangular region 28 inscribed in the circuit board connecting terminals 24 or the ball electrodes 26. The rectangular region 28 in FIG. 2 is a hatched region surrounded by a dotted line.

From the viewpoint of increasing mechanical strength of the semiconductor device 100, the area of the second semiconductor unit 20 is desirably 50% or more of the area of the rectangular region 28 inscribed in the circuit board connecting terminals 24 or the ball electrodes 26 on the multilayer interconnection layer 18 side and more desirably, 70% or more.

Figure 3:
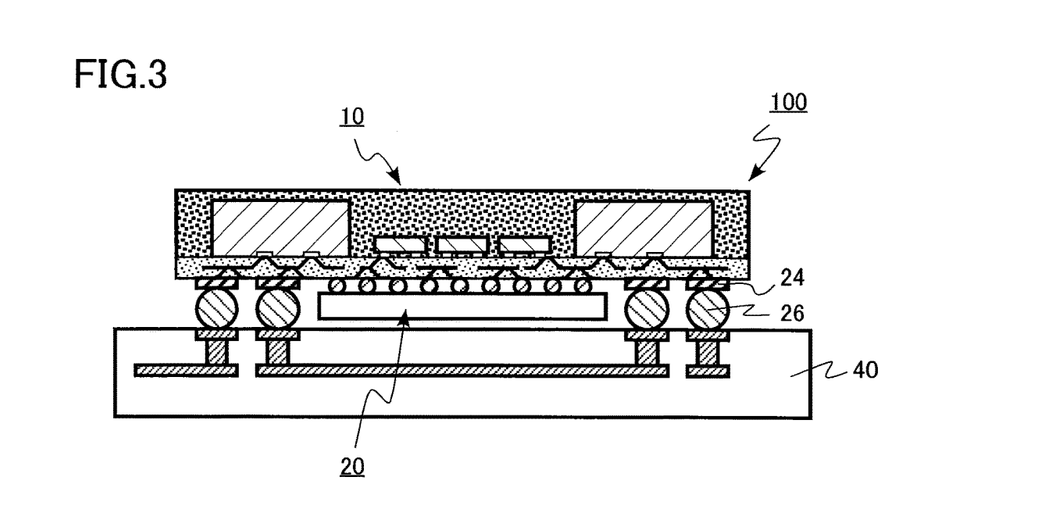
FIG. 3 is a schematic sectional view of an electronic circuit device according to the first embodiment.

FIG. 3 is a schematic sectional view of an electronic circuit device according to the present embodiment. As shown in FIG. 3, the semiconductor device 100 is mounted on a circuit board 40. The semiconductor device 100 is mounted on the circuit board 40 via the ball electrode 26 provided on the circuit board connecting electrode 24. The second semiconductor unit 20 is configured to be positioned between the first semiconductor unit 10 and the circuit board 40.

As the circuit board 40, for example, a printed board SLC (Surface Laminar Circuit) board of a mode in which an insulating layer and a conductor layer are alternately built up on a glass epoxy substrate can be used. Also, a publicly known flexible board in which a polyimide resin is used as the main board material and which has a copper wire formed on the surface thereof can be used. The circuit board 40 constituting the electronic circuit device is not particularly limited.

Incidentally, a encapsulation resin as a publicly known technology may be provided in a gap between the semiconductor device 100 and the circuit board 40 if necessary. As the encapsulation resin, for example, an epoxy resin containing bisphenol epoxy, an imidazole catalytic hardener, an acid anhydride hardener, and a spherical quartz filler of 45 wt % in percent by weight can be used. Also, an epoxy resin melt obtained by grinding, mixing, and melting, for example, cresol novolac type epoxy resin (ECON-195XL; fabricated by Sumitomo Chemical Co. Ltd.) 100 wt. part, phenol resin 54 wt. part as a hardener, molten silica 100 wt. part as a filler, benzyldimethylamine 0.5 wt. part as a catalyst, and carbon black 3 wt. part and silane coupling agent 3 wt. part as other additives can be used. The material of the encapsulation resin is not particularly limited.

By including the above configuration, an electronic circuit device according to the present embodiment has improved mechanical strength of the semiconductor device 100. Therefore, according to the present embodiment, an electronic circuit device superior in reliability can be realized. In addition, with the semiconductor device 100 being made smaller in size, a smaller electronic circuit device on which the semiconductor device 100 is mounted can be realized.

Next, an example of the method for fabricating a semiconductor device according to the present embodiment will be described. FIGS. 4 to 11 are schematic sectional views of a semiconductor device in the process of being fabricated by the method for fabricating the semiconductor device in the present embodiment.

Figure 4:
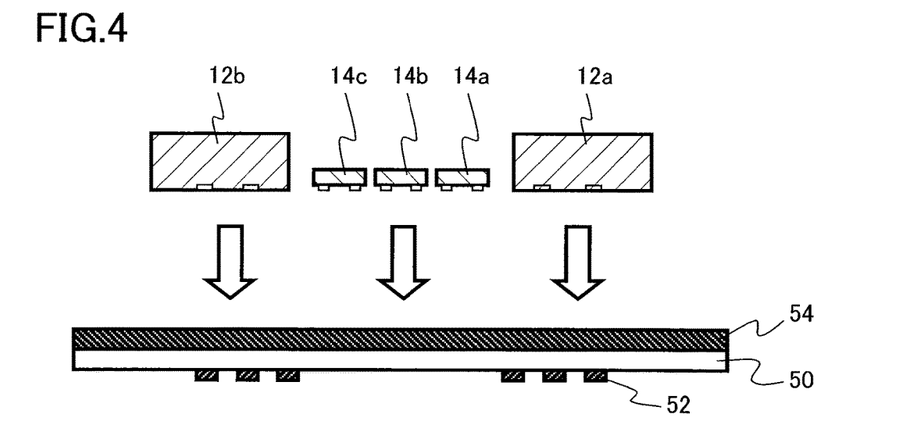
FIG. 4 is a schematic sectional view of the semiconductor device in the process of being fabricated by a method for fabricating the semiconductor device in the first embodiment.

First, the plurality of first semiconductor chips 12a-g and the plurality of passive elements 14a-d are prepared. Then, a glass mask 50 having an aligning pattern 52 provided on one side and an adhesion layer 54 provided on the other side is prepared (FIG. 4). The adhesion layer 54 is, for example, an adhesive whose adhesive strength is changed by heating.

Figure 5:
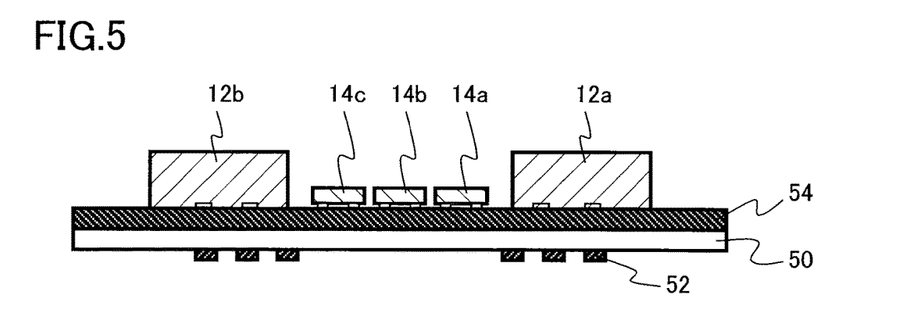
FIG. 5 is a schematic sectional view of the semiconductor device in the process of being fabricated by the method for fabricating the semiconductor device in the first embodiment.

Next, the plurality of first semiconductor chips 12a-g and the plurality of passive elements 14a-d are bonded to the side of the adhesion layer 54 of the glass mask 50 (FIG. 5). At this point, the plurality of first semiconductor chips 12a-g and the plurality of passive elements 14a-d are aligned with respect to the glass mask 50 by using the aligning pattern 52.

Figure 6:
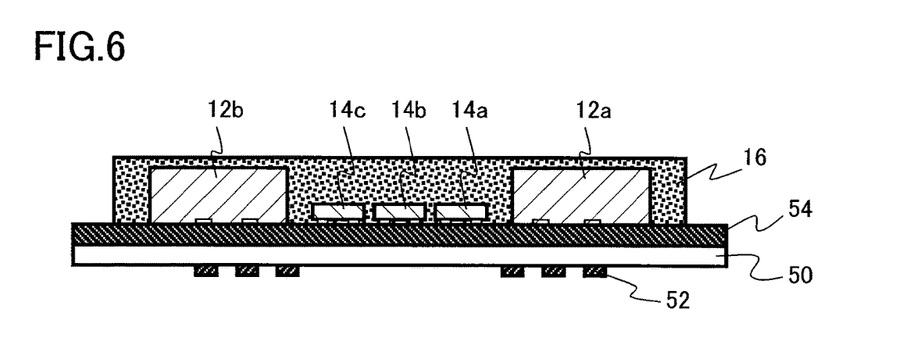
FIG. 6 is a schematic sectional view of the semiconductor device in the process of being fabricated by the method for fabricating the semiconductor device in the first embodiment.

Next, the first semiconductor chips 12a-g and the passive elements 14a-d are coated with the organic resin 16 (FIG. 6). The organic resin 16 is, for example, an epoxy resin containing a silica filler. For the formation of coating of the organic resin 16, it is desirable to use a vacuum printing technology capable of filling fine gaps with a resin.

Figure 7:
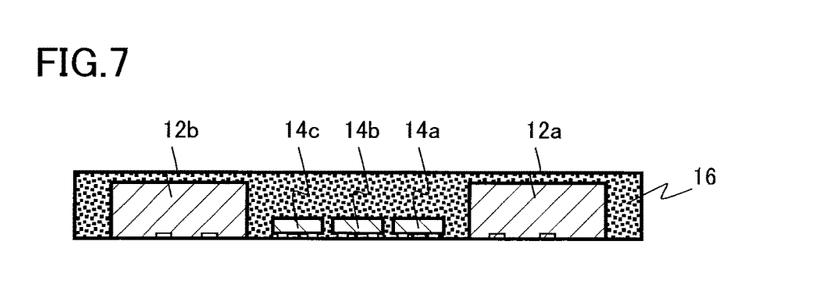
FIG. 7 is a schematic sectional view of the semiconductor device in the process of being fabricated by the method for fabricating the semiconductor device in the first embodiment.

Next, the first semiconductor chips 12*a-g* and the passive elements 14*a-d* are peeled off from the adhesion layer 54. Accordingly, a reconstructed wafer in which the first semiconductor chips 12*a-g* and the passive elements 14*a-d* are bonded by the organic resin 16 is formed (FIG. 7).

Figure 8:
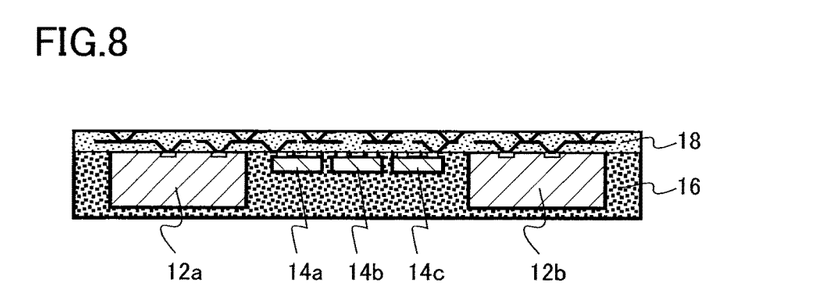
FIG. 8 is a schematic sectional view of the semiconductor device in the process of being fabricated by the method for fabricating the semiconductor device in the first embodiment.

Next, the multilayer interconnection layer 18 is formed on the reconstructed wafer (FIG. 8). The multilayer interconnection layer 18 is formed by alternately stacking an insulating layer and a thin film wiring layer.

The insulating layer is, for example, a photosensitive resin and more specifically, for example, polyimide. Exposure conditions for patterning when the photosensitive resin is used may be determined in accordance with sensitivity of the photosensitive resin. When, for example, UR3140 fabricated by Toray Industries Inc. is used as polyimide, 100 mJ/cm$^2$ or so is desirable as exposure conditions. Then, for example, DV-505 fabricated by Toray Industries Inc. is used as the developer for development and an opening to form a contact to terminal of the first semiconductor chips 12*a-g* and the passive elements 14*a-d* is thereby patterned.

Further, a thin film wiring layer that connects each terminal of the first semiconductor chips 12*a-g* and the passive elements 14*a-d* is formed on the insulating layer by publicly known process technology. The thin film wiring layer is, for example, a stacked film of Al (aluminum) and Ti (titanium). The thin film wiring layer is desirably a metal or alloy containing one element selected from a group of Ti, Ni, Al, Cu, Au, Pb, Sn, Pd, and W.

Figure 9:
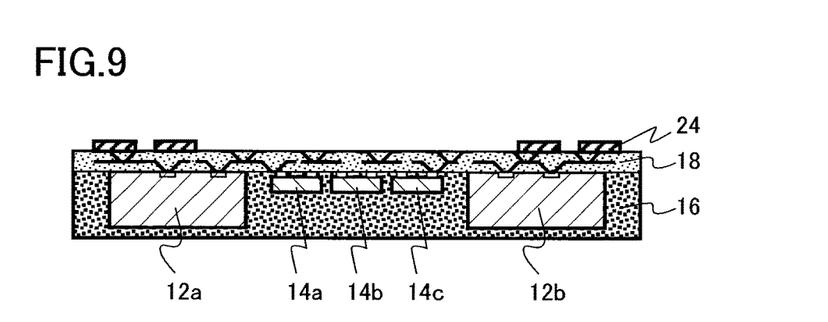
FIG. 9 is a schematic sectional view of the semiconductor device in the process of being fabricated by the method for fabricating the semiconductor device in the first embodiment.

Thereafter, the multilayer interconnection layer 18 of as many layers as necessary is formed by alternately stacking an insulating layer and a thin film wiring layer. Then, the plurality of circuit board connecting terminals 24 is formed on the upper portion of the multilayer interconnection layer 18 (FIG. 9). The circuit board connecting electrode 24 is a metal. More specifically, the circuit board connecting electrode is a stacked film of, for example, Au (gold), Ni (nickel), and Ti (titanium).

Next, the second semiconductor unit 20 on which solder bump electrodes are formed by a publicly known technology is prepared. The second semiconductor unit 20 is, for example, a bare chip (second semiconductor chip). The second semiconductor unit 20 is, for example, MCU. The solder bump electrode is, for example, PbSn alloy solder.

More specifically, the solder bump electrode is formed by the method shown below. After the semiconductor wafer on which MCU is formed is coated with Cu/Ti by EB deposition, the thick resist AZ4903 (fabricated by Hoechst Japan) is formed to a thickness of 50 µm by the spin coating method to form an opening of 80 µm, which is larger than an I/O electrode having an opening dimension of 50 µmφ by exposure and development. A sufficient amount of energy is irradiated for exposure if the resist is thick and the AZ400K developer (fabricated by Hoechst Japan) is used for development.

Further, an MCU wafer in which a plating resist film of a portion corresponding to the I/O electrode is open is immersed in a Pb/Sn plating solution shown below to perform plating, with Ni/Ti as a cathode and, for example, a high-purity eutectic solder plate corresponding to the following electro-plating solution as an anode. The current density is setup to 1 to 4 (A/dm$^2$) and a solder alloy whose solder composition (Pb/Sn) is approximately equal to the eutectic composition or a composition slightly shifted to the Pb side or the Sn side is deposited to a thickness of 50 µm on Ni/Ti while the plating solution being slowly stirred at the bath temperature of 25° C.

(Composition of the Sulfonic Acid Solder Plating Solution)

| | |
|---|---|
| Tin ion (Sn$^{2+}$) | 12 Vol % |
| Lead ion (Pb$^{2+}$) | 30 Vol % |
| Aliphatic sulfonic acid | 41 Vol % |
| Nonionic surface active agent | 5 Vol % |
| Cationic surface active agent | 5 Vol % |
| Isopropyl alcohol | 7 Vol % |

Next, the electroplating resist is removed by acetone. Further, after the wafer is immersed in a solution containing citric acid/hydrogen peroxide solution to remove Cu by etching, the wafer is immersed in a mixed solution containing ethylenediamine tetra-acetic acid/ammonia/hydrogen peroxide solution/pure water to remove Ti by etching. The second semiconductor unit 20 can be prepared by, for example, the above method.

Figure 10:
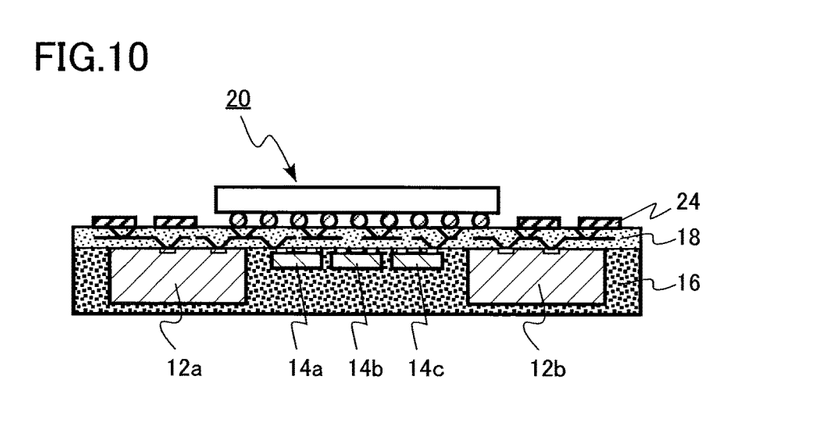
FIG. 10 is a schematic sectional view of the semiconductor device in the process of being fabricated by the method for fabricating the semiconductor device in the first embodiment.

Next, the second semiconductor unit (second semiconductor chip) 20 is fixed onto the multilayer interconnection layer 18 by flip-chip mounting as a publicly known technology (FIG. 10). The solder bump electrode diameter is, for example, 100 µmφ. Incidentally, an organic resin can be formed between the second semiconductor unit 20 and the first semiconductor unit 10 as a encapsulation resin.

Figure 11:
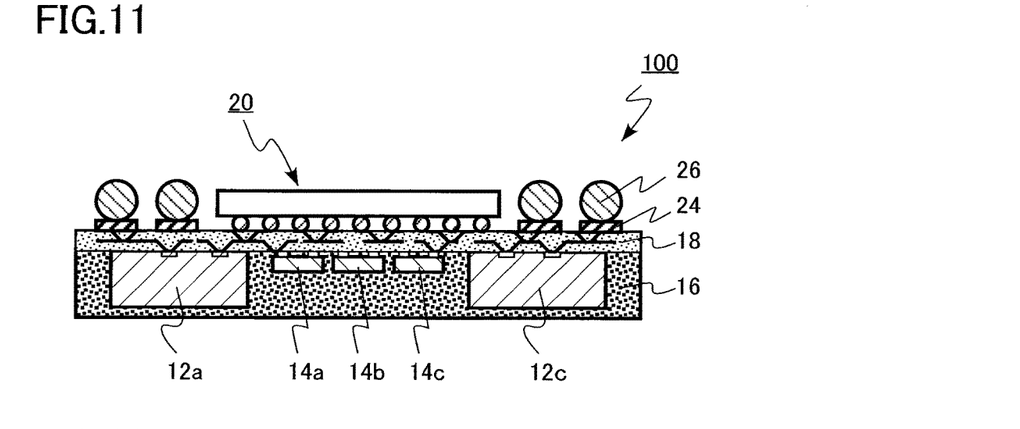
FIG. 11 is a schematic sectional view of the semiconductor device in the process of being fabricated by the method for fabricating the semiconductor device in the first embodiment.

Next, the solder ball electrodes 26 of, for example, 500 µmφ in diameter are formed on the circuit board connecting terminals 24 around the second semiconductor unit (second semiconductor chip) 20 (FIG. 11). The solder composition is assumed to be, for example, Sn-3.0Ag-0.5Cu. A ball mounter as a publicly known technology is used for solder ball mounting.

With the above fabricating method, the semiconductor device 100 according to the present embodiment shown in FIG. 1 is fabricated.

Next, the method for fabricating an electronic circuit device according to the present embodiment shown in FIG. 3 will be described with reference to FIG. 3.

First, the circuit board 40 is prepared. Next, the semiconductor device 100 and electrode terminals of the circuit board 40 are aligned. The semiconductor device 100 is pre-heated in a nitrogen atmosphere at, for example, 350° C. by being held by a collet having a heating mechanism.

Next, the collet is moved further downward to apply a pressure of, for example, 30 kg/mm$^2$ while the ball electrode 26 of the semiconductor device 100 and the electrode terminal of the circuit board 40 are in contact. Further in this state, the temperature is raised to 370° C. to melt the solder. Accordingly, the semiconductor device 100 and the electrode terminal of the circuit board 40 are connected.

With the above fabricating method, the electronic circuit device on which the semiconductor device 100 according to the present embodiment shown in FIG. 3 is mounted is fabricated.

Figure 12:
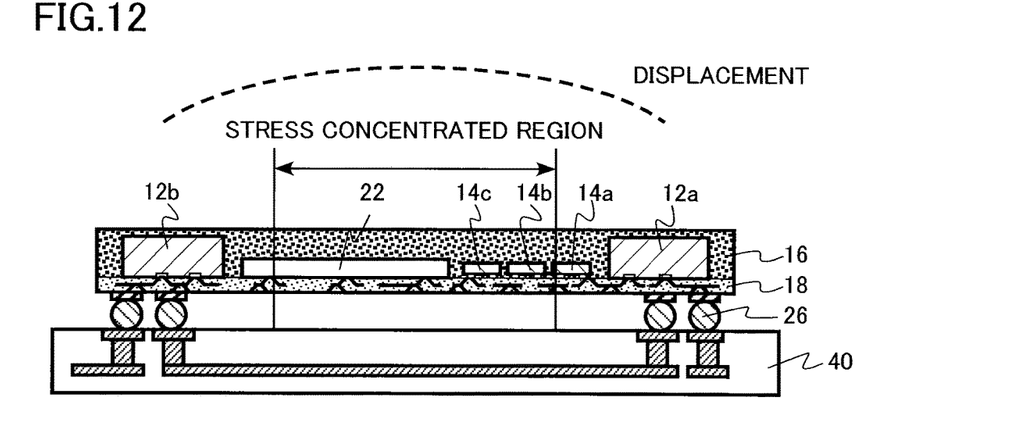
FIG. 12 is a diagram illustrating workings and effects of the first embodiment.
Figure 13:
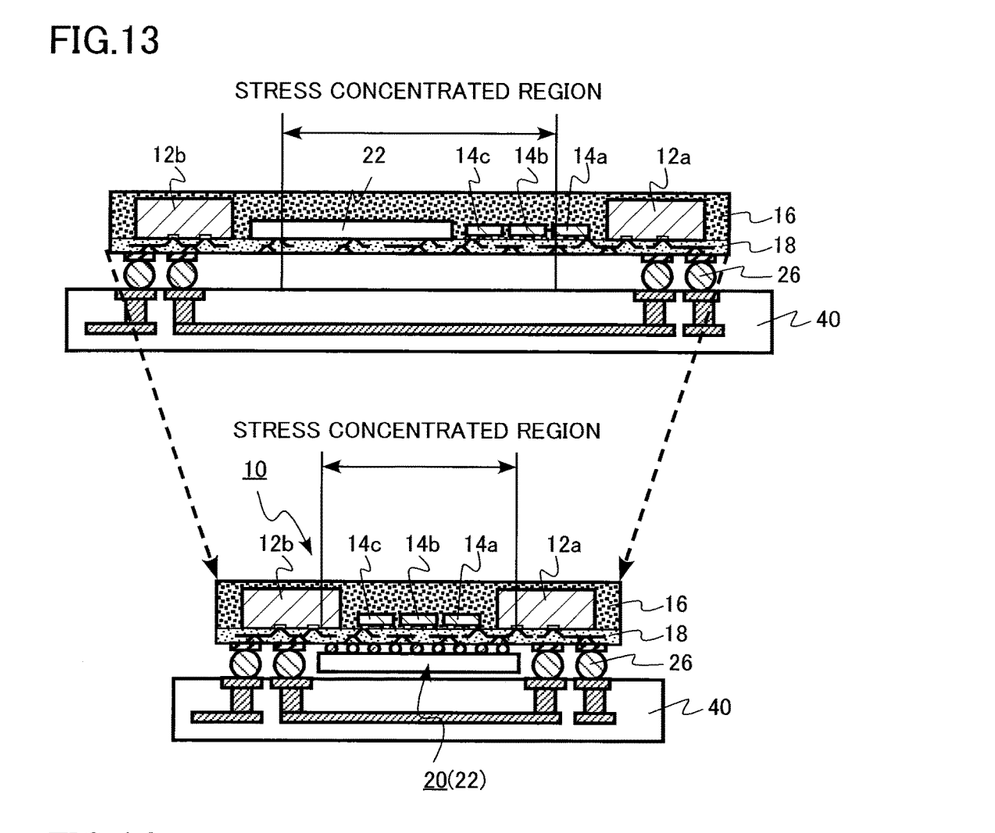
FIG. 13 is a diagram illustrating the workings and effects of the first embodiment.

Next, operations and effects of a semiconductor device and an electronic circuit device according to the present embodiment will be described. FIGS. 12 and 13 are diagrams illustrating workings and effects of the present embodiment.

FIG. 12 shows, in contrast to the present embodiment, a case of a semiconductor device and an electronic circuit device in a comparative form without the second semiconductor unit. If, as shown in FIG. 12, a pseudo-SoC in which the second semiconductor chip 22 is arranged is mounted on the circuit board 40 using the ball electrode 26, the stress is concentrated in a stress concentrated region between the ball electrodes 26 resulting from a difference of CTE (coefficient of thermal expansion) or the like between the pseudo-SoC and the circuit board 40 and in FIG. 12, for example, a displacement as indicated by a dotted line arises in the pseudo-SoC. As a result, a reliability failure such as an open circuit to the circuit board 40 after the pseudo-SoC breakdown arises.

The pseudo-SoC has weak mechanical strength particularly in a portion of the organic resin 40 connecting elements. Then, the destruction is more likely to occur on the multilayer interconnection layer 18 side. The destruction is more likely to occur with an increasing number of elements arranged in the pseudo-SoC.

In FIG. 13, the upper diagram shows the comparative form and the lower diagram shows a semiconductor device and an electronic circuit device according to the present embodiment. In the present embodiment, the second semiconductor chip 22 arranged in the pseudo-SoC in the comparative form is mounted as the second semiconductor unit 20 on the multilayer interconnection layer 18 side of the first semiconductor unit (pseudo-SoC) 10.

With the above configuration, the weak multilayer interconnection layer 18 side in the stress concentrated region is reinforced by the second semiconductor unit 20. In addition, on the multilayer interconnection layer 18 side, the first semiconductor unit (pseudo-SoC) 10 is reinforced by the second semiconductor unit 20 being fixed extending over a particularly weak portion of the organic resin 16 connecting elements. Therefore, reliability failures such as an open circuit to the circuit board 40 after the pseudo-SoC breakdown are reduced.

The first semiconductor unit (pseudo-SoC) 10 is made smaller in size for a space of the removed second semiconductor chip 22. Therefore, when compared with the comparative form, a semiconductor device reduced in size and having the same function can be realized. That is, a semiconductor device with a high packaging density per unit area can be realized. In addition, the stress concentrated region itself is also decreased by making the semiconductor device smaller and also from this viewpoint, reliability failures can be reduced.

From the viewpoint of making the semiconductor device 100 smaller in size and improving mechanical strength thereof, the area of the second semiconductor chip 22 is desirably larger than that of any of the plurality of first semiconductor chips 12a-g. To realize the function of the semiconductor device 100, the semiconductor device 100 can be made smaller most efficiently by selecting the second semiconductor unit 20 as the largest semiconductor chip in area.

Then, with the semiconductor device 100 being made smaller, the stress concentrated region is decreased and reliability failures are reduced. In addition, by reinforcing the first semiconductor unit 10 by the semiconductor chip with the largest area, mechanical strength of the semiconductor device 100 is improved and reliability failures are reduced.

According to the present embodiment, as described above, a semiconductor device and an electronic circuit device that have high reliability can be realized by acquiring high mechanical strength. In addition, a smaller semiconductor device and electronic circuit device and improvements of packaging density can be realized.

Second Embodiment

A semiconductor device and an electronic circuit device according to the present embodiment are the same as those in the first embodiment except that a third semiconductor unit fixed to the opposite side of a second semiconductor unit of a first semiconductor unit, having a third semiconductor chip, and electrically connected to the first semiconductor unit is further included. Thus, a description of content overlapping with content in the first embodiment is omitted.

Figure 14:
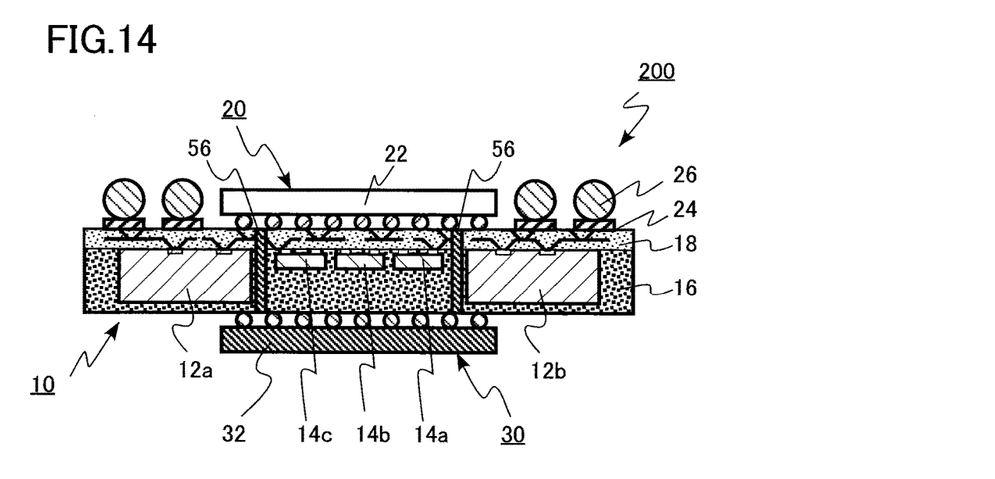
FIG. 14 is a schematic sectional view of a semiconductor device according to a second embodiment.

FIG. 14 is a schematic sectional view of a semiconductor device according to the present embodiment. As shown in FIG. 14, a semiconductor device 200 according to the present embodiment includes the first semiconductor unit 10, the second semiconductor unit 20 fixed to the first semiconductor unit 10, and a third semiconductor unit 30 fixed to the opposite side of the second semiconductor unit of the first semiconductor unit 10.

The third semiconductor unit 30 is fixed to the opposite side of the multilayer interconnection layer 18 of the first semiconductor unit 10, that is, to the opposite side of the second semiconductor unit 20.

The third semiconductor unit 30 has a third semiconductor chip 32. The third semiconductor chip 32 is an active element. The third semiconductor chip 32 is, for example, wireless communication LSI that performs wireless communication with external devices. The third semiconductor chip 32 includes, for example, the Bluetooth function.

The third semiconductor unit 30 may be a bare chip of the third semiconductor chip 32 itself or a semiconductor package including the third semiconductor chip 32. From the viewpoint of making the semiconductor device 200 smaller in size, the third semiconductor unit 30 is desirably a bare chip or wafer level CSP (Chip Size Package).

The third semiconductor unit 30 is electrically connected to the first semiconductor unit 10 and the second semiconductor unit. The third semiconductor unit 30 is, for example, a bare chip (third semiconductor chip) and is electrically connected and fixed to the first semiconductor unit 10 by being flip-chip mounted thereon.

The first semiconductor unit 10 is provided with, for example, a TMV (Through Mold Via) electrode 56 passing through the organic resin 16 from one side to the other side of the first semiconductor unit 10. The third semiconductor unit 30 is electrically connected to the first semiconductor unit 10 and the second semiconductor unit via the TMV (Through Mold Via) electrode 56.

To increase the strength of fixing the third semiconductor unit 30 to the first semiconductor unit 10, a encapsulation resin of an organic resin may be provided between the third semiconductor unit 30 and the first semiconductor unit 10.

From the viewpoint of making the semiconductor device 200 smaller in size and improving mechanical strength thereof, the area of the second semiconductor chip 22 or the third semiconductor chip 32 is desirably larger than that of any of the plurality of first semiconductor chips 12a-g.

Figure 15:
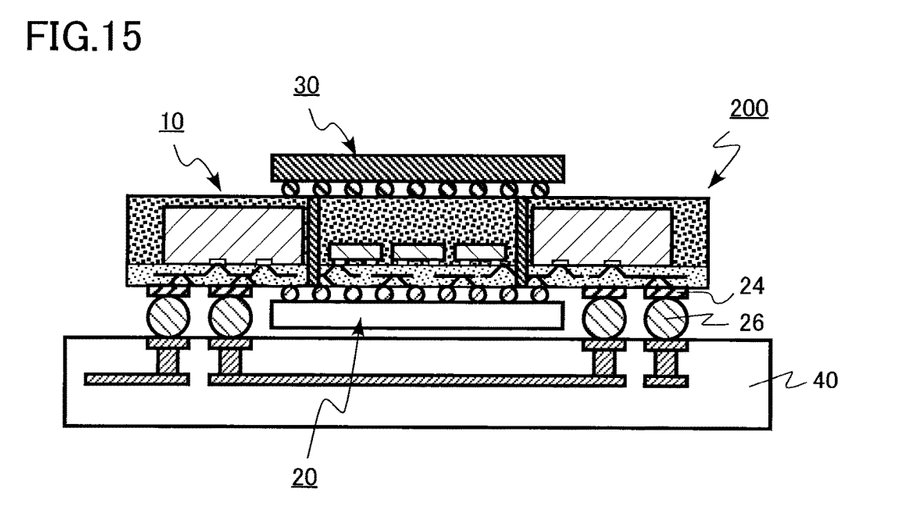
FIG. 15 is a schematic sectional view of an electronic circuit device according to the second embodiment.

FIG. 15 is a schematic sectional view of an electronic circuit device according to the present embodiment. As shown in FIG. 15, the semiconductor device 200 is mounted on the circuit board 40. The semiconductor device 200 is mounted on the circuit board 40 via the ball electrode 26 provided on the circuit board connecting electrode 24.

Next, an example of the method for fabricating a semiconductor device according to the present embodiment will be described. FIGS. 16 to 19 are schematic sectional views of a semiconductor device in the process of being fabricated by the method for fabricating the semiconductor device in the present embodiment.

Figure 16:
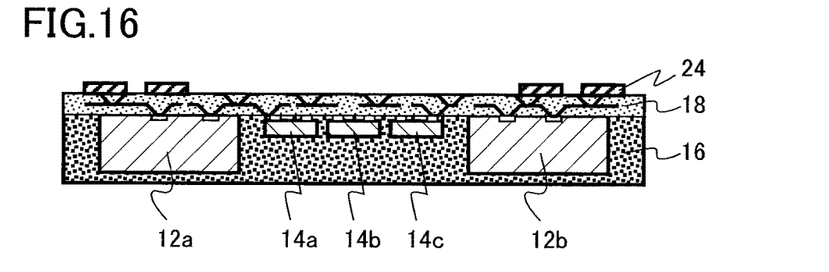
FIG. 16 is a schematic sectional view of the semiconductor device in the process of being fabricated by the method for fabricating the semiconductor device in the second embodiment.

The method is the same as the fabricating method in the first embodiment until the plurality of circuit board connecting terminals 24 is formed on the upper portion of the multilayer interconnection layer 18 on the reconstructed wafer (FIG. 16).

Figure 17:
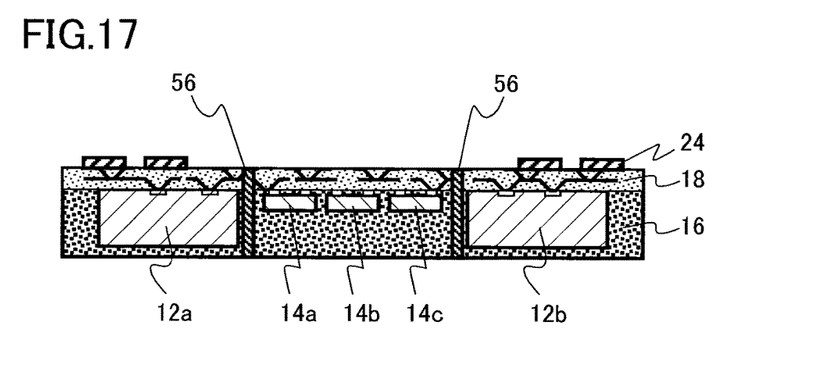
FIG. 17 is a schematic sectional view of the semiconductor device in the process of being fabricated by the method for fabricating the semiconductor device in the second embodiment.

Next, the TMV (Through Mold Via) electrode 56 passing through the organic resin 16 from one side to the other side of the first semiconductor unit 10 is formed (FIG. 17). The TMV (Through Mold Via) 56 can be formed by using, for example, the publicly known TMV (Through Mold Via) technology by which a through hole passing through the organic resin 16 is provided and the through hole is filled with metal. Thereafter, for example, a wiring layer (not shown) is formed on the surface on the opposite side of the multilayer interconnection layer 18 of the first semiconductor unit 10.

Figure 18:
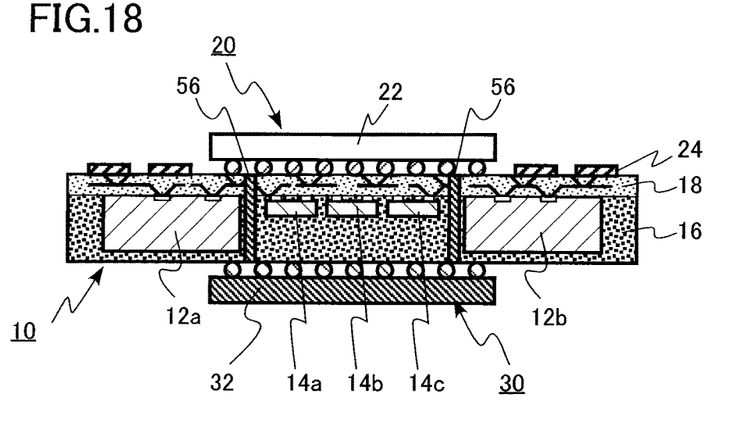
FIG. 18 is a schematic sectional view of the semiconductor device in the process of being fabricated by the method for fabricating the semiconductor device in the second embodiment.

Next, the second semiconductor unit 20 and the third semiconductor unit 30 on which solder bump electrodes are formed by a publicly known technology are prepared. Then, the second semiconductor unit (second semiconductor chip) 20 and the third semiconductor unit (third semiconductor chip) 30 are fixed to the first semiconductor unit 10 by flip-chip mounting as a publicly known technology (FIG. 18).

Figure 19:
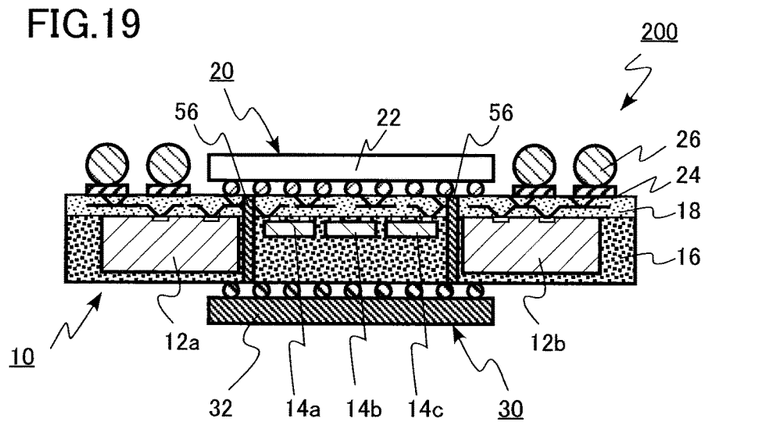
FIG. 19 is a schematic sectional view of the semiconductor device in the process of being fabricated by the method for fabricating the semiconductor device in the second embodiment.

Next, the solder ball electrodes 26 of, for example, 500 µmϕ in diameter are formed on the circuit board connecting terminals 24 around the second semiconductor unit (second semiconductor chip) 20 (FIG. 19).

With the above fabricating method, the semiconductor device 200 according to the present embodiment shown in FIG. 14 is fabricated.

Then, an electronic circuit device on which the semiconductor device 200 according to the present embodiment shown in FIG. 15 is provided is fabricated by mounting the semiconductor device 200 on the circuit board 40 by the method similar to that in the first embodiment.

According to the present embodiment, with the reinforcement by the third semiconductor unit 30, mechanical strength of the semiconductor device 200 is further improved. Therefore, a semiconductor device and an electronic circuit device that have high reliability can be realized. In addition, a smaller semiconductor device and electronic circuit device and improvements of packaging density can be realized by moving the third semiconductor chip 32 from the first semiconductor unit 10 to the third semiconductor unit 30.

Third Embodiment

A semiconductor device and an electronic circuit device according to the present embodiment are the same as those in the first embodiment except that a reinforcing plate fixed to the opposite side of a second semiconductor unit of a first semiconductor unit is further included. Thus, a description of content overlapping with content in the first embodiment is omitted.

Figure 20:
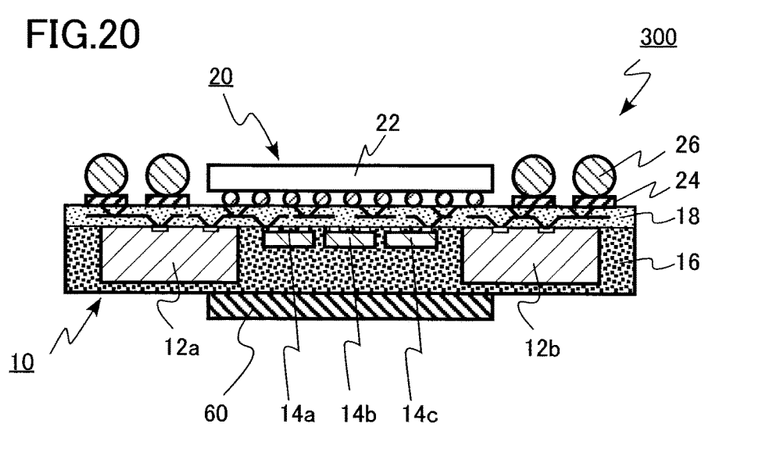
FIG. 20 is a schematic sectional view of a semiconductor device according to a third embodiment.

FIG. 20 is a schematic sectional view of a semiconductor device according to the present embodiment. As shown in FIG. 20, a semiconductor device 300 according to the present embodiment includes the first semiconductor unit 10, the second semiconductor unit 20 fixed to the first semiconductor unit 10, and a reinforcing plate 60 fixed to the opposite side of the second semiconductor unit of the first semiconductor unit 10.

The material of the reinforcing plate 60 is, for example, a metal or semiconductor. More specifically, the material is, for example, Cu (copper). The reinforcing plate 60 is fixed to the first semiconductor unit 10 by, for example, a adhesion layer of resin or the like.

Figure 21:
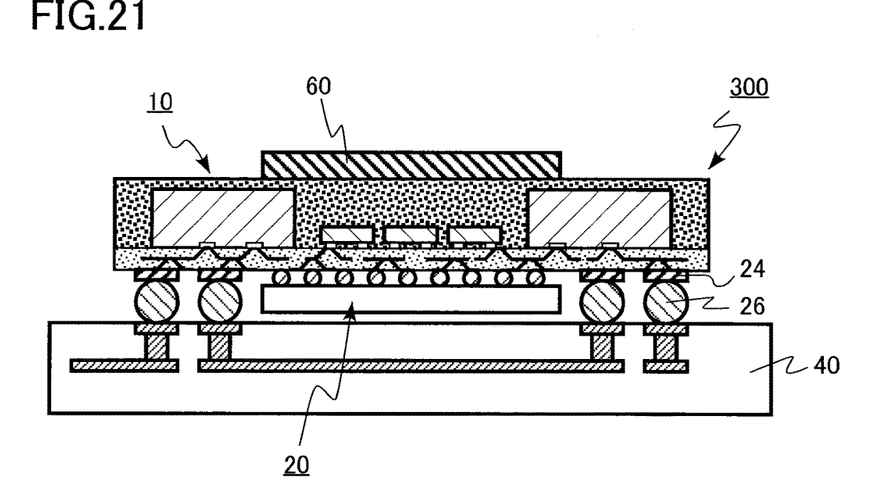
FIG. 21 is a schematic sectional view of an electronic circuit device according to the third embodiment.

FIG. 21 is a schematic sectional view of an electronic circuit device according to the present embodiment. As shown in FIG. 21, the semiconductor device 300 is mounted on the circuit board 40. The semiconductor device 300 is mounted on the circuit board 40 via the ball electrode 26 provided on the circuit board connecting electrode 24.

According to the present embodiment, with the reinforcement by the reinforcing plate 60, mechanical strength of the semiconductor device 300 is further improved. Therefore, a semiconductor device and an electronic circuit device that have high reliability can be realized. In addition, it is only necessary to fix the reinforcing plate 60 to the first semiconductor unit 10 in the first embodiment and therefore, a semiconductor device and an electronic circuit device that have high reliability can easily be realized.

Fourth Embodiment

A semiconductor device and an electronic circuit device according to the present embodiment are the same as those in the third embodiment except that a first semiconductor unit has an embedded component that passes through an organic resin and a reinforcing plate is connected to the embedded component. Thus, a description of content overlapping with content in the third embodiment is omitted.

Figure 22:
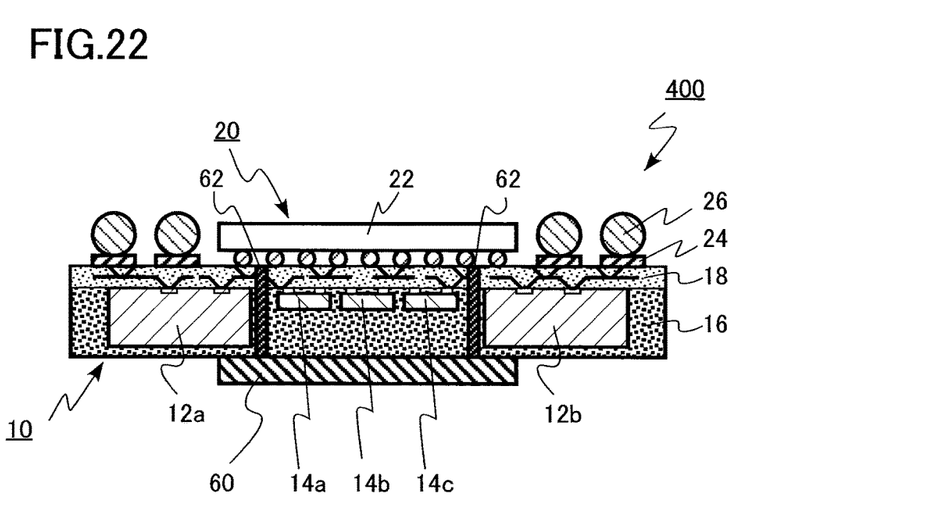
FIG. 22 is a schematic sectional view of a semiconductor device according to a fourth embodiment.

FIG. 22 is a schematic sectional view of a semiconductor device according to the present embodiment. As shown in FIG. 22, in a semiconductor device 400 according to the present embodiment, the first semiconductor unit 10 includes a embedded component 62 passing through the organic resin 16. Then, the reinforcing plate 60 is connected to the embedded component 62.

The material of the embedded component 62 is desirably a material of high thermal conductivity. For example, the material is a metal or semiconductor. More specifically, the material is, for example, Cu (copper).

The material of the reinforcing plate 60 is desirably a material of high thermal conductivity. For example, the material is a metal or semiconductor. More specifically, the material is, for example, Cu (copper). The reinforcing plate 60 is fixed to the first semiconductor unit 10 by, for example, a adhesion layer of resin or the like. A material of high thermal conductivity is desirable at least between the reinforcing plate 60 and the embedded component 62.

Figure 23:
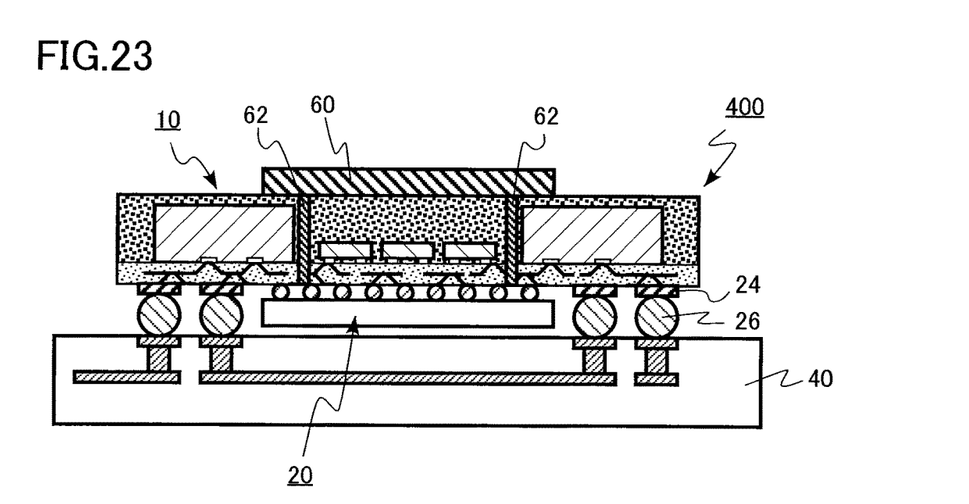
FIG. 23 is a schematic sectional view of an electronic circuit device according to the fourth embodiment.

FIG. 23 is a schematic sectional view of an electronic circuit device according to the present embodiment. As shown in FIG. 23, the semiconductor device 400 is mounted on the circuit board 40. The semiconductor device 400 is mounted on the circuit board 40 via the ball electrode 26 provided on the circuit board connecting electrode 24.

According to the present embodiment, with the reinforcement by the reinforcing plate 60, like in the third embodiment, mechanical strength of the semiconductor device 400 is further improved. Therefore, a semiconductor device and an electronic circuit device that have high reliability can be realized. When compared with the third embodiment, heat of the first semiconductor unit 10 and the second semiconductor unit is propagated to the reinforcing plate 60 via the embedded component 62 so that the reinforcing plate 60 functions also as a heat spreader plate. Therefore, heat dissipation is improved, the thermal stress is mitigated, and further, a semiconductor device and an electronic circuit device that have high reliability can be realized.

EXAMPLES

Examples will be described below.

Example 1

The semiconductor device 100 configured in the same manner as in the first embodiment shown in FIG. 1 is created and mounted on the circuit board 40 to evaluate reliability thereof.

The first semiconductor chips 12a-g constituting the first semiconductor unit 10 of a semiconductor device are assumed to include two analog switches and 10 operational amplifiers. The passive elements 14a-d are assumed to include 36 chip resistors and 25 chip capacitors. The organic resin 16 is assumed to be an epoxy resin containing a silica filler.

The size of the first semiconductor unit 10 is 7 mm×6 mm×1 mm. The passive elements 14a-d all have a 0603 size, the analog switch has the size of 2 mm×2 mm×0.3 mm, and the operational amplifier has the size of 1.5 mm×1.5 mm×0.3 mm.

The ball electrodes 26 are assumed to include 64 solder balls and configured by Sn-37Pb. The diameter of the ball electrode 26 is assumed to be 500 μmϕ.

The second semiconductor unit 20 is assumed to be a bare chip of MCU and flip-chip mounted on the first semiconductor unit 10. The size of the bare chip of MCU is 3.5 mm×3.5 mm×0.45 mm. The second semiconductor unit 20 is assumed to include 64 bump electrodes configured by Sn-3.0Ag-0.5Cu.

Two types of samples, a sample (including a encapsulation resin) provided with a encapsulation resin between the semiconductor device 100 and the circuit board 40 and a sample (no encapsulation resin) provided with no encapsulation resin, are created.

Reliability of samples is evaluated by the temperature cycle test. The number of samples of each type is 1000 and the temperature cycle test is performed under the temperature cycle test conditions (−55° C. (30 min) to 25° C. (5 min) to 125° C. (30 min) to 25° C. (5 min)). If any one of 64 pins becomes an open circuit, the sample is determined to be a failure.

Comparative Example

Samples are created in the same manner as in Example 1 except that the second semiconductor unit 20 is not provided, MCU of the second semiconductor unit 20 is arranged inside the first semiconductor unit, and the size of the first semiconductor unit 10 is 9 mm×8 mm×1 mm, and the same temperature cycle test is performed.

Figure 24:
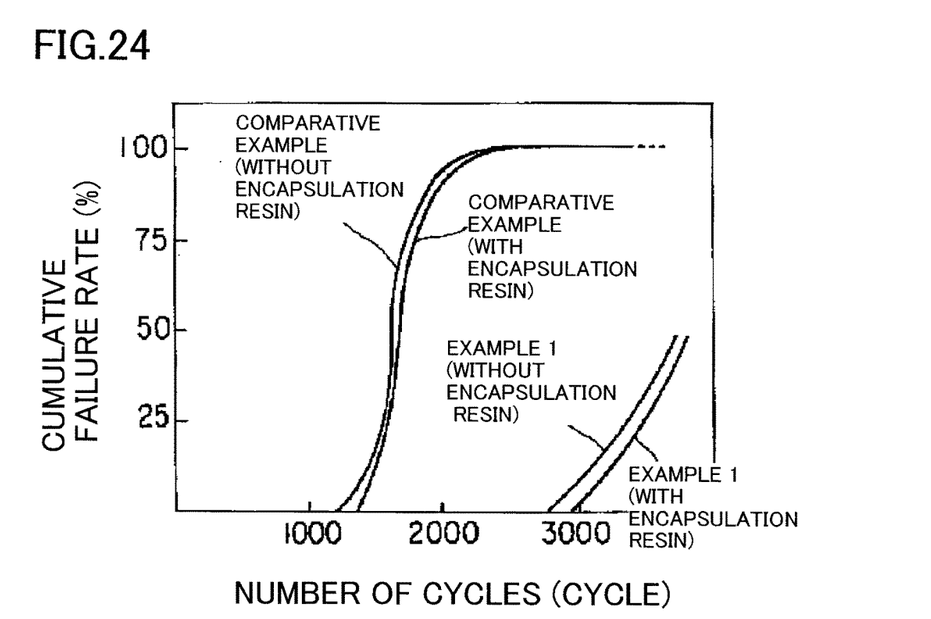
FIG. 24 is a diagram showing reliability test results of Example 1 and Comparative Example.

FIG. 24 is a diagram showing reliability test results of Example 1 and Comparative Example. The vertical axis represents the cumulative failure rate and the horizontal axis represents the number of temperature cycles. As shown in FIG. 24, the cumulative failure rate reaches 100% after 2000 cycles in Comparative Example. In Example 1, by contrast, no failure is confirmed until 2800 cycles even in samples without encapsulation resin. Fault locations of Comparative Example include destruction of the multilayer interconnection layer 18 of the first semiconductor unit 10.

Reliability of a semiconductor device in Example 1 has been confirmed extremely high. The size of a semiconductor device in Example 1 is about 60% of the size of a semiconductor device in Comparative Example so that improvements of integration density are realized in Example 1.

Example 2

The semiconductor device 200 configured in the same manner as in the second embodiment shown in FIG. 14 is created and mounted on the circuit board 40 to evaluate reliability thereof.

Samples are created in the same manner as in Example 1 except that a Bluetooth chip of 3.5 mm×3.5 mm×0.45 mm is newly mounted on the first semiconductor unit 10 as the third semiconductor unit 30 to perform a similar temperature cycle test.

In Example 2, no failure is confirmed until 5000 cycles even in samples without encapsulation resin. Improvement of reliability from Example 1 have been confirmed.

Example 3

The semiconductor device 300 configured in the same manner as in the third embodiment shown in FIG. 20 is created and mounted on the circuit board 40 to evaluate reliability thereof.

Samples are created in the same manner as in Example 1 except that a copper plate of 3.5 mm×3.5 mm×0.5 mm is newly provided as the reinforcing plate 60 to perform a similar temperature cycle test.

In Example 3, no failure is confirmed until 5000 cycles even in samples without encapsulation resin. Improvement of reliability from Example 1 have been confirmed.

While certain embodiments have been described, these embodiments have been presented by way of example only, and are not intended to limit the scope of the inventions. Indeed, a semiconductor device and an electronic circuit device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first semiconductor unit including a plurality of first semiconductor chips, an organic resin provided between the first semiconductor chips, a wiring layer provided above the first semiconductor chips to electrically connect the first semiconductor chips to each other, and a plurality of connecting terminals provided on an upper portion of the wiring layer;
    a second semiconductor unit fixed to a wiring layer side of the first semiconductor unit, the second semiconductor unit fixed to a region surrounded by the connecting terminals, the second semiconductor unit having a second semiconductor chip, the second semiconductor unit electrically connected to the first semiconductor unit; and
    ball electrodes provided on the connecting terminals, the second semiconductor unit being surrounded by the ball electrodes.

2. The device according to claim 1, wherein the first semiconductor unit includes a plurality of passive elements, the organic resin is provided between the passive elements, and the organic resin is provided between the passive elements and the first semiconductor chips.

3. The device according to claim 1, wherein an area of the second semiconductor chip is larger than an area of any of the plurality of first semiconductor chips.

4. The device according to claim 1, further comprising a third semiconductor unit fixed to an opposite side of the second semiconductor unit of the first semiconductor unit, the third semiconductor unit having a third semiconductor chip, the third semiconductor unit electrically connected to the first semiconductor unit.

5. The device according to claim 1, further comprising a reinforcing plate fixed to an opposite side of the second semiconductor unit of the first semiconductor unit.

6. The device according to claim 5, wherein the first semiconductor unit includes an embedded component passing through the organic resin, the reinforcing plate is connected to the embedded component.

7. The device according to claim 1, wherein the second semiconductor unit is a bare chip and is flip-chip mounted on the wiring layer.

8. The device according to claim 1, wherein the second semiconductor unit is wafer level CSP.

9. The device according to claim 1, wherein an area of the second semiconductor unit is 50% or more of an area of a rectangular region inscribed in the connecting terminals on the side of the wiring layer.

10. The device according to claim 1, wherein the organic resin contains a silica filler, and the organic resin is at least one organic resin selected from an epoxy resin, a polyimide resin, and benzocyclobutene (BCB).

11. The device according to claim 1, wherein the ball electrode is a metal or an alloy containing at least one element selected from a group of Ti, Ni, Al, Cu, Au, Ag, Pb, Sn, Pd, and W.

12. An electronic circuit device comprising:
a semiconductor device including a first semiconductor unit, a second semiconductor unit, and ball electrodes, the first semiconductor unit including a plurality of first semiconductor chips, an organic resin provided between the first semiconductor chips, a wiring layer provided above the first semiconductor chips to electrically connect the first semiconductor chips to each other, a plurality of connecting terminals provided on an upper portion of the wiring layer, the second semiconductor unit fixed to a wiring layer side of the first semiconductor unit, the second semiconductor unit fixed to a region surrounded by the connecting terminals, the second semiconductor unit having a second semiconductor chip, the second semiconductor unit electrically connected to the first semiconductor unit, the ball electrodes provided on the connecting terminals, the second semiconductor unit being surrounded by the ball electrodes; and
a circuit board on which the semiconductor device is mounted via ball electrodes provided on the connecting terminals.

13. The device according to claim 12, wherein the first semiconductor unit includes a plurality of passive elements, the organic resin is provided between the passive elements, and the organic resin is provided between the passive elements and the first semiconductor chips.

14. The device according to claim 12, wherein an area of the second semiconductor chip is larger than an area of any of the plurality of first semiconductor chips.

15. The device according to claim 12, further comprising a third semiconductor unit fixed to an opposite side of the second semiconductor unit of the first semiconductor unit, the third semiconductor unit having a third semiconductor chip, the third semiconductor unit electrically connected to the first semiconductor unit.

16. The device according to claim 12, further comprising a reinforcing plate fixed to an opposite side of the second semiconductor unit of the first semiconductor unit.

17. The device according to claim 16, wherein the first semiconductor unit includes an embedded component passing through the organic resin, the reinforcing plate is connected to the embedded component.

18. The device according to claim 12, wherein the second semiconductor unit is a bare chip and is flip-chip mounted on the wiring layer.

19. The device according to claim 12, wherein the second semiconductor unit is wafer level CSP.

* * * * *